US010407194B2

(12) United States Patent
Swanson et al.

(10) Patent No.: US 10,407,194 B2
(45) Date of Patent: Sep. 10, 2019

(54) LOW TEMPERATURE SELF-SEALING VACUUM PACKAGING

(71) Applicant: SPAWAR Systems Center Pacific, San Diego, CA (US)

(72) Inventors: Paul D. Swanson, Santee, CA (US); Andrew Wang, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 337 days.

(21) Appl. No.: 15/621,845

(22) Filed: Jun. 13, 2017

(65) Prior Publication Data

US 2017/0361963 A1 Dec. 21, 2017

Related U.S. Application Data

(60) Provisional application No. 62/352,674, filed on Jun. 21, 2016.

(51) Int. Cl.
 B65B 31/02 (2006.01)
(52) U.S. Cl.
 CPC ...... B65B 31/025 (2013.01); *B81B 2207/093* (2013.01); *B81B 2207/097* (2013.01)
(58) Field of Classification Search
 CPC .......... B65B 31/02; B65B 31/025; H01J 9/39; H01J 9/40; H01H 50/023; H05K 5/064; B81B 2207/093; B81B 2207/097; B81C 1/00261; B81C 1/00293; B81C 2203/0145

USPC .................. 53/403, 404, 405, 432, 484, 510
See application file for complete search history.

(56) References Cited

U.S. PATENT DOCUMENTS

| 3,826,634 | A | * | 7/1974 | Blust et al. | ............. C03B 23/20 |
| | | | | | 53/403 |
| 4,063,349 | A | * | 12/1977 | Passler et al. | ......... H05K 5/064 |
| | | | | | 53/403 |
| 4,689,936 | A | * | 9/1987 | Gaikema et al. | ..... B29C 67/004 |
| | | | | | 53/432 |
| 5,307,985 | A | * | 5/1994 | Beizermann | ......... B65D 77/225 |
| | | | | | 206/439 |
| 6,946,728 | B2 | * | 9/2005 | Chen et al. | ......... B81C 1/00293 |
| | | | | | 257/678 |
| 7,491,567 | B2 | | 2/2009 | Dcamp et al. | |
| 2003/0104651 | A1 | | 6/2003 | Kim | |
| 2006/0134825 | A1 | | 6/2006 | Dcamp | |
| 2008/0090320 | A1 | | 4/2008 | Heck | |
| 2013/0167482 | A1 | | 7/2013 | Fu | |

(Continued)

*Primary Examiner* — Stephen F. Gerrity
(74) *Attorney, Agent, or Firm* — Naval Information Warfare Center, Pacific; Kyle Eppele

(57) ABSTRACT

A method and system involves vacuum sealing a semi-enclosure at room temperature without requiring mechanical actions within the vacuum chamber. The semi-enclosure has an inlet channel that extends inwardly into the vacuum chamber from an exterior opening (entryway) into the semi-enclosure. An uncured entryway vacuum sealant is provided at the entryway for the semi-enclosure. A vacuum is established in the vacuum chamber until the vacuum pressure reaches a desired vacuum pressure that causes the uncured entryway sealant to be provided to the entryway for the semi-enclosure. The uncured entryway vacuum sealant is cured under vacuum pressure in the semi-enclosure in the vacuum chamber.

20 Claims, 6 Drawing Sheets

(56) References Cited

U.S. PATENT DOCUMENTS

2015/0274508 A1\* 10/2015 Yoshizawa .......... B81C 1/00333
257/415

\* cited by examiner

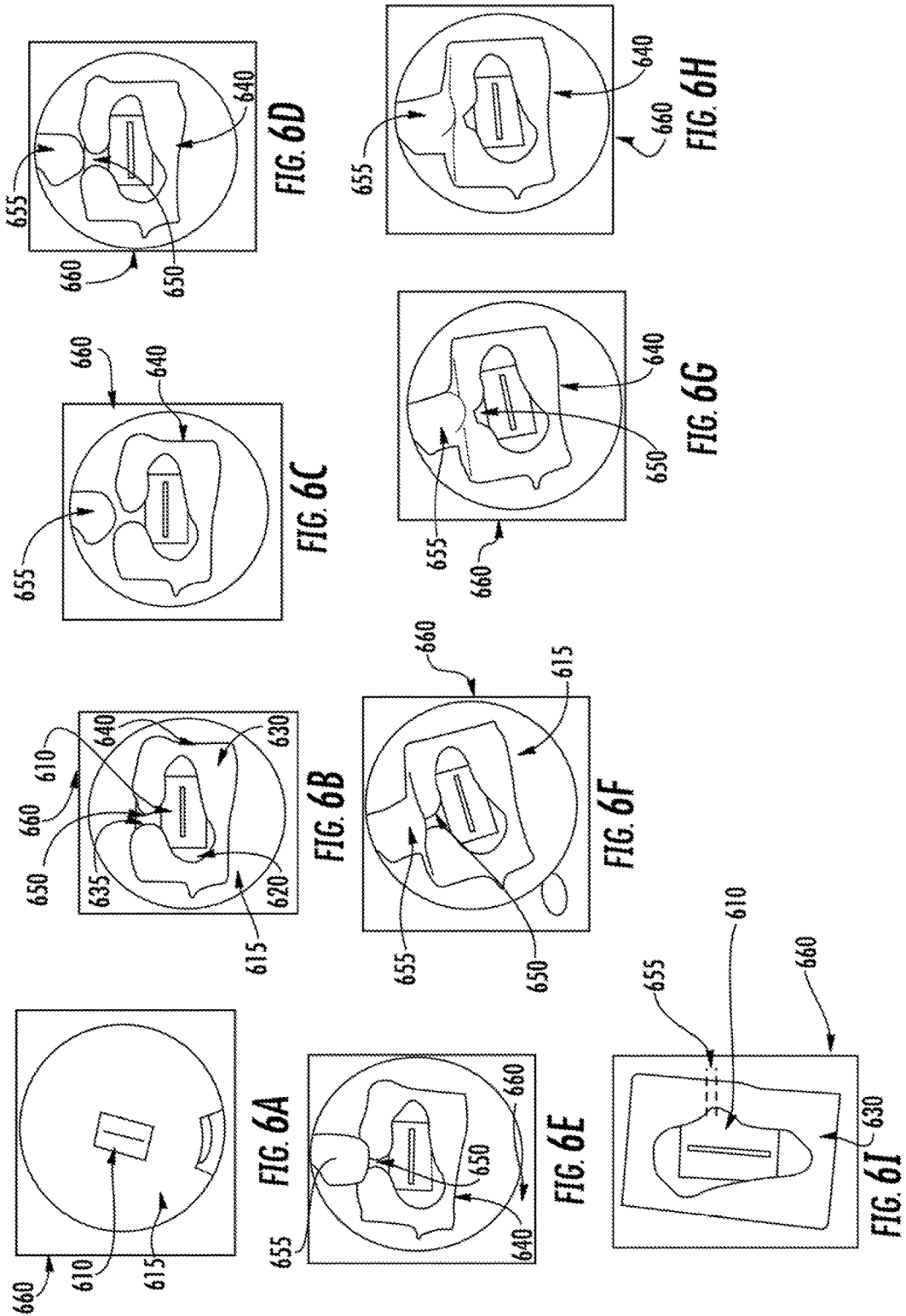

LOW TEMPERATURE SELF-SEALING VACUUM PACKAGING

CROSS-REFERENCE TO RELATED APPLICATIONS

The present application claims priority from U.S. Provisional Application No. 62/352,674 filed Jun. 21, 2016, the entire disclosure of which is incorporated herein by reference.

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619) 553-5118; email: ssc_pac_t2@navy.mil, referencing NC 103088.

FIELD OF THE INVENTION

The present invention pertains generally to packaging. More particularly, the present invention pertains to vacuum packaging.

BACKGROUND OF THE INVENTION

Micro-electromechanical systems (MEMS) and other devices may need to operate within a vacuum environment. MEMS devices may be mounted in containers with sealed leads for electrical connections, placed in a vacuum system and pumped down. Thereafter, a lid with a solder gasket may be lowered onto the packaging. Solder may be melted to seal the device chamber so that the chamber remains under vacuum when the device is removed from the vacuum system.

This conventional technique requires the MEMS device, or other device, to survive the high temperatures of melting the solder gasket so that the MEMS device is subject to undesirable thermal expansion. The conventional technique may also require a mechanical device to lower the lid after the vacuum system has reached the desired pressure.

A need exists for a system and method to vacuum seal MEMS devices and other devices without requiring high temperatures or mechanical actions within the vacuum chamber.

SUMMARY OF THE INVENTION

According to illustrative embodiments, a method and system are provided for low temperature self-sealing vacuum packaging. In accordance with one embodiment of the present disclosure, a method is provided for low temperature self-sealing vacuum packaging. The method comprises providing a semi-enclosure to be vacuum sealed in a vacuum chamber, the semi-enclosure having an inlet channel that extends inwardly into the vacuum chamber from an entryway into the semi-enclosure.

The method further includes providing an uncured entryway vacuum sealant at the entryway of the semi-enclosure, and wherein a viscosity of the uncured entryway vacuum sealant and a size of the entryway are configured to permit the uncured entryway vacuum sealant to substantially cover the entryway when a desired pressure is reached in the vacuum chamber.

The method also includes establishing a vacuum in the vacuum chamber until a desired vacuum pressure is reached in the semi-enclosure, the desired vacuum pressure being configured to cause the uncured entryway vacuum sealant to substantially cover the entryway of the semi-enclosure due to a difference in pressure between the desired vacuum pressure and a vacuum chamber pressure, wherein the desired vacuum pressure is lower than the vacuum chamber pressure.

The method still further includes curing the uncured entryway vacuum sealant under vacuum pressure in the semi-enclosure in the vacuum chamber.

These, as well as other objects, features and benefits will now become clear from a review of the following detailed description, the illustrative embodiments, and the accompanying drawings.

BRIEF DESCRIPTION OF THE DRAWINGS

The novel features of the present invention will be best understood from the accompanying drawings, taken in conjunction with the accompanying description, in which similarly-referenced characters refer to similarly-referenced parts, and in which:

FIGS. 6A-6I are pictorials of the stages of packaging for low temperature vacuum sealing of a MEMS device in accordance with one embodiment of the present disclosure.

DETAILED DESCRIPTION OF THE EMBODIMENTS

Figure 1B:
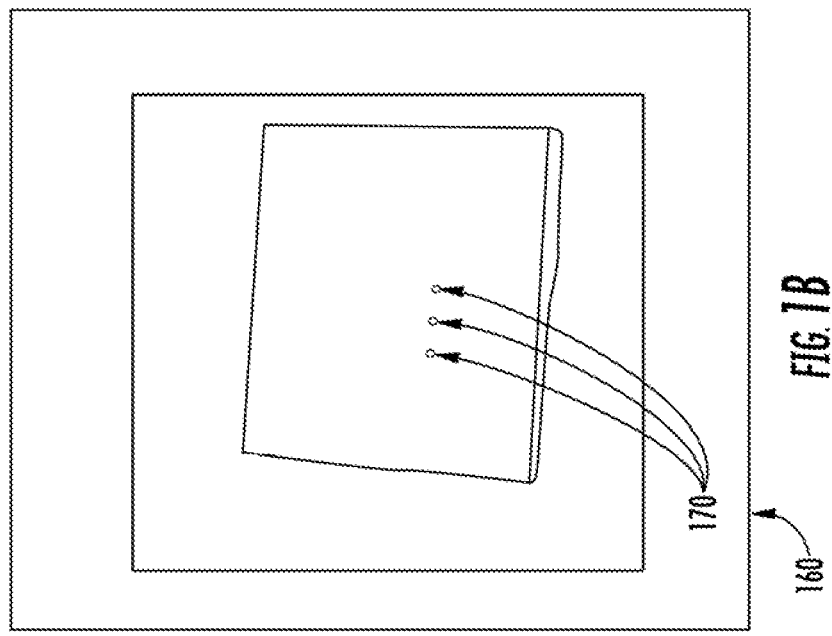
FIG. 1B is a back view of a packaged MEMS device as encased in epoxy with a glass cover.

According to illustrative embodiments, a method and system are provided for low temperature self-sealing vacuum packaging. Referring now to FIG. 1A, a front view is shown of a MEMS device package 100 that has already been vacuum sealed in accordance with an embodiment of the present disclosure. MEMS device 110 is disposed in MEMS device package 100. MEMS device 110 is surrounded by a cavity 120. Around the cavity 120 is a vacuum sealant 130 such as a suitable epoxy resin. Cavity 120 may provide a protective space around MEMS device 110 so that vacuum sealant 130 does not touch the MEMS device 110. The MEMS device 110, the cavity 120 and vacuum sealant 130 are enclosed in a semi-enclosure 140 such as a glass cover. Semi-enclosure 140 was originally sealed with vacuum sealant 130, except at the entryway 145 and inlet channel 150.

Before sealing of the MEMS device package, the entryway 145 had provided an opening in the exterior wall of semi-enclosure 140 for access to inlet channel 150. Then, uncured entryway vacuum sealant 155 entered the entryway 145 into inlet channel 150. The inlet channel 150 was thereby substantially filled with uncured entryway vacuum sealant 155. Uncured entryway vacuum sealant 155 may be the same type, or different from, the vacuum sealant 130 that was already inside semi-enclosure 140.

Prior to the time that the inlet channel 150 was substantially filled with uncured entryway vacuum sealant 155, it was an open inlet channel 150 between the MEMS device 110 and the interior of vacuum chamber 160, which is outside of MEMS device package 100. The entryway 145 connected to inlet channel 150 which, in turn, connected to cavity 120. Cavity 120 may be immediately adjacent MEMS device 110. Cavity 120 may provide a protective empty space between MEMS device 110, sealant 130 and uncured entryway vacuum sealant 155.

The outside environment of the MEMS device package 100, which may be the interior of vacuum chamber 160, may operate under vacuum pressure when the vacuum chamber 160 is operating at a vacuum pressure.

It should be noted that in lieu of the semi-enclosure 140 being a glass cover, other types of semi-enclosures or covers could be used to carry out the method and system described herein, as long as the semi-enclosure 140 or cover is suitable to withstand a vacuum. Further, it should be noted that the present system and method can be used for vacuum sealing objects other than MEMS device 110. For example, the present system and method can be used for vacuum packaging edible products and/or freeze-dried products.

Before the entryway 145 was covered with uncured entryway vacuum sealant 155, the vacuum chamber 160 operated at a desired pressure. The desired pressure caused gas to bubble through a puddle of uncured entryway vacuum sealant 155 at the entryway 145 in the vacuum chamber 160. Thus, air or other gas was pumped out of the semi-enclosure 140. The inlet channel 150 was then closed by slightly increasing the pressure in the vacuum chamber 160. After the vacuum sealant 130 and/or uncured entryway vacuum sealant 155 cured under vacuum, the packaged MEMS device 110 was removed from the vacuum chamber 160 and any excess sealant from vacuum sealant 130 and/or excess uncured entryway vacuum sealant 160 was removed from the MEMS device package 100.

The types of MEMS devices, e.g., 110, that are suitable for vacuum sealing with the present method and system, include but are not limited to, cantilever-based devices, resonators, gyroscopes, accelerometers, and any devices that require vacuum conditions or low pressure relative to atmosphere. For example, devices that require low pressures, e.g., pressures below 100 millitorr, may be suitable for vacuum sealing using the present system and method. The present system and method may also be used for vacuum packaging of food and other edible or ingestible products. In this manner, vacuum packaging may aid in ensuring that the interior contents of the package do not oxidize. Lyophilization is one such process where oxidation may be important to avoid. Using lyophilization, a liquid may be inserted into a package with something that is cold. The contents of the package may then be freeze-dried. It should also be noted that vacuum packaging may also be desirable for space-saving purposes.

The present system and method could be used for vacuum sealing essentially any container that can withstand the necessary vacuum pressures to accomplish the vacuum sealing process. The necessary pressures may include two vacuum pressures. The first target pressure or desired pressure is a pressure necessary to provide uncured entryway vacuum sealant 155 to the entryway 145 of the inlet channel 150. The second target vacuum pressure or increased pressure is optional. The second target vacuum pressure or increased pressure is somewhat higher than the first target pressure or desired vacuum pressure. The increased pressure may be sufficient to cause the uncured entryway vacuum sealant 155 to substantially fill the inlet channel 150.

In the case where a device is vacuum sealed inside MEMS package 100, including MEMS device 110, the method permits the MEMS device 110 to be pre-packaged in a cavity with only a single inlet channel 150 accessible via the entryway 145. The entryway 145 may have dimensions suitable for preventing uncured entryway vacuum sealant 155 from readily flowing down the inlet channel 150. For example, entryway 145 may be small, e.g., on the order of one millimeter (1 mm). In addition to the size or dimensions of the entryway 145, another factor that may influence whether the uncured entryway vacuum sealant 155 readily flows down the channel is viscosity of the uncured entryway vacuum sealant 155 that is used. The inlet channel 150 may end at cavity 120. Gravity may be yet another factor in whether the uncured entryway vacuum sealant 155 readily flows down the channel. For example, the entryway 145 of semi-enclosure 140 may generally point upwards to facilitate gravity forcing the uncured entryway vacuum sealant 155 into the entryway 145.

In order to be suitable for the present system and method, the vacuum sealant 130 and uncured entryway vacuum sealant 155 may have suitable viscosity, a relatively low vapor pressure, and may be able to cure under vacuum over a period of several hours. It may be desirable, but not required, for vacuum sealant 130 to have similar properties as the uncured entryway vacuum sealant 155. However, vacuum sealant 130 may be cured before uncured entryway vacuum sealant 155 and may therefore, have different requirements.

It may be desirable for vacuum sealant 130 uncured entryway vacuum sealant 155 to have sufficient viscosity to allow the uncured entryway vacuum sealant 155 to readily flow down the inlet channel 150 of semi-enclosure 140. This factor, in addition to the size or dimensions of the entryway 145, may influence whether the uncured entryway vacuum sealant 155 readily flows down the inlet channel 150. As a limitation on the flow of the uncured entryway vacuum sealant 155, it may be desirable for the uncured entryway vacuum sealant 155 to flow down the inlet channel 150 without entering the semi-enclosure 140.

The vacuum sealant 130 and uncured entryway vacuum sealant 155 may also need to have a relatively low vapor pressure. For example, it may be desirable for vacuum sealant 130 and uncured entryway vacuum sealant 155 to have vapor pressure in the range of $1.0 \times 10^{-5}$ Torr to $1.0 \times 10^{-9}$ Torr, depending on temperature. It may be desirable for the vacuum sealant 130 and uncured entryway vacuum sealant 155 to be capable of withstanding a broad temperature range. The temperature range could be from −45 degrees Celsius (° C.) to 120° C. It should be noted that, in lieu of the vacuum sealant 130 and uncured entryway vacuum sealant 155 having a low vapor pressure, a heat-safe sealant could be used. The vacuum sealant 130 and uncured entryway vacuum sealant 155 that are suitable for use with the present method and system may also need to be able to cure under vacuum over a period of several hours without degradation or other undesirable effects. For example, it may be desirable for vacuum sealant 130 and uncured entryway vacuum sealant 155 to be capable of curing for twenty-four (24) hours at 25° C., or for two (2) hours at 60° C. Some organic sealants may be used as vacuum sealant 130 and uncured entryway vacuum sealant 155. However, organic sealants are usually not desired or suitable for vacuum packaging due to, for example, the propensity for outgassing.

The interior of semi-enclosure 140 may be filled with vacuum sealant 130 and uncured entryway vacuum sealant 155 (except in the cavity 120 around the MEMS device 110). The semi-enclosure 140 may be placed into a vacuum chamber 160. The vacuum chamber 160 may be closed and pumped down. For purposes of the present disclosure, "pumped down" means to provide a lower pressure, thus creating a greater vacuum. As the pressure in the vacuum chamber 160 falls, the pressure in the MEMS device package 100 may be equilibrated with pressure in the vacuum chamber 160 by bubbling gas through the uncured entryway vacuum sealant 155. Gas need not be bubbled through the vacuum sealant 130 in order to accomplish substantial cover/closure of the entryway 145, since only the uncured entryway vacuum sealant 155 would cover the entryway 145. The uncured entryway vacuum sealant 155 may be sufficiently thick so that when the gas bubble pops, it briefly creates an open channel all the way to the MEMS device 110.

After the vacuum system reaches the desired vacuum pressure, optionally, an increase in pressure may be made to the desired vacuum pressure. This increase may force the uncured entryway vacuum sealant 155 into the inlet channel 150. However, it may be desirable that the increase in pressure is not so high that it forces the uncured entryway vacuum sealant 155 onto the MEMS device 110. The low temperature, self-sealing vacuum packaging system is then allowed to continue to pump down, and the uncured entryway vacuum sealant 155 is allowed to cure. If the vacuum sealant 130 was uncured, it may be allowed to cure as well. The vacuum sealant 130 and/or uncured entryway vacuum sealant 155 may be allowed to cure outside the vacuum chamber. However, because the vacuum sealant 130 and uncured entryway vacuum sealant 155 are suitable for the vacuum environment, either one or both of the vacuum sealant 130 and uncured entryway vacuum sealant 155 may be allowed to cure under vacuum. After the vacuum sealant 130 and uncured entryway vacuum sealant 155 are substantially cured, the MEMS device package 100 can be removed from the vacuum chamber 160. The reservoir and excess vacuum sealant 130 and uncured entryway vacuum sealant 155 may be removed from the MEMS device package 100.

Figure 1A:
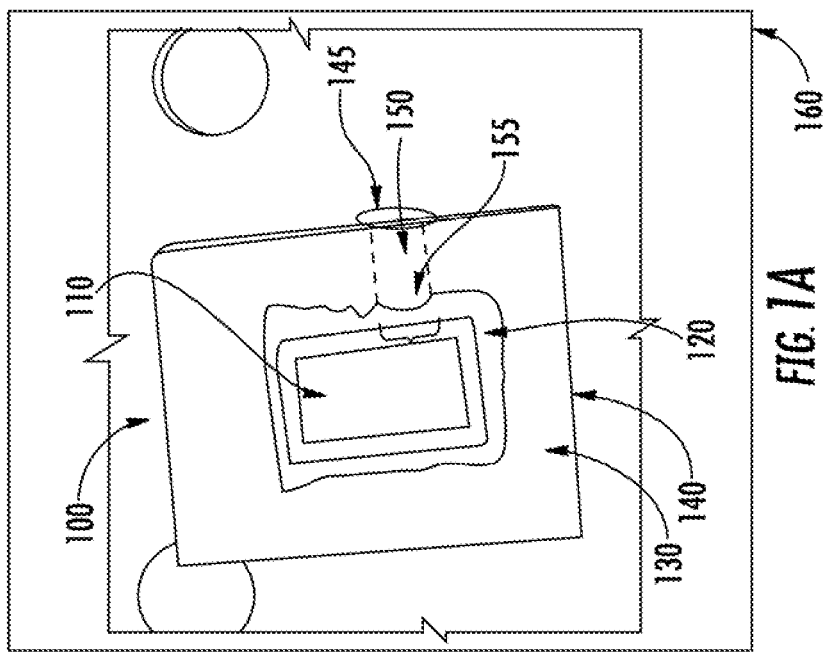
FIG. 1A is a front view of a packaged MEMS device as encased in epoxy with a glass cover.

FIG. 1B is a back view of a packaged MEMS device 110 as encased in vacuum sealant 130 and uncured entryway vacuum sealant 155 inside semi-enclosure 140. MEMS devices require electrical contacts. Therefore, the vacuum sealant 130 and/or uncured entryway vacuum sealant 155 in FIG. 1B was sanded down so that silver epoxy feed-throughs 170 could protrude through the back. In lieu of silver epoxy feed-throughs, other conductive feed-throughs could be used.

Figure 2:
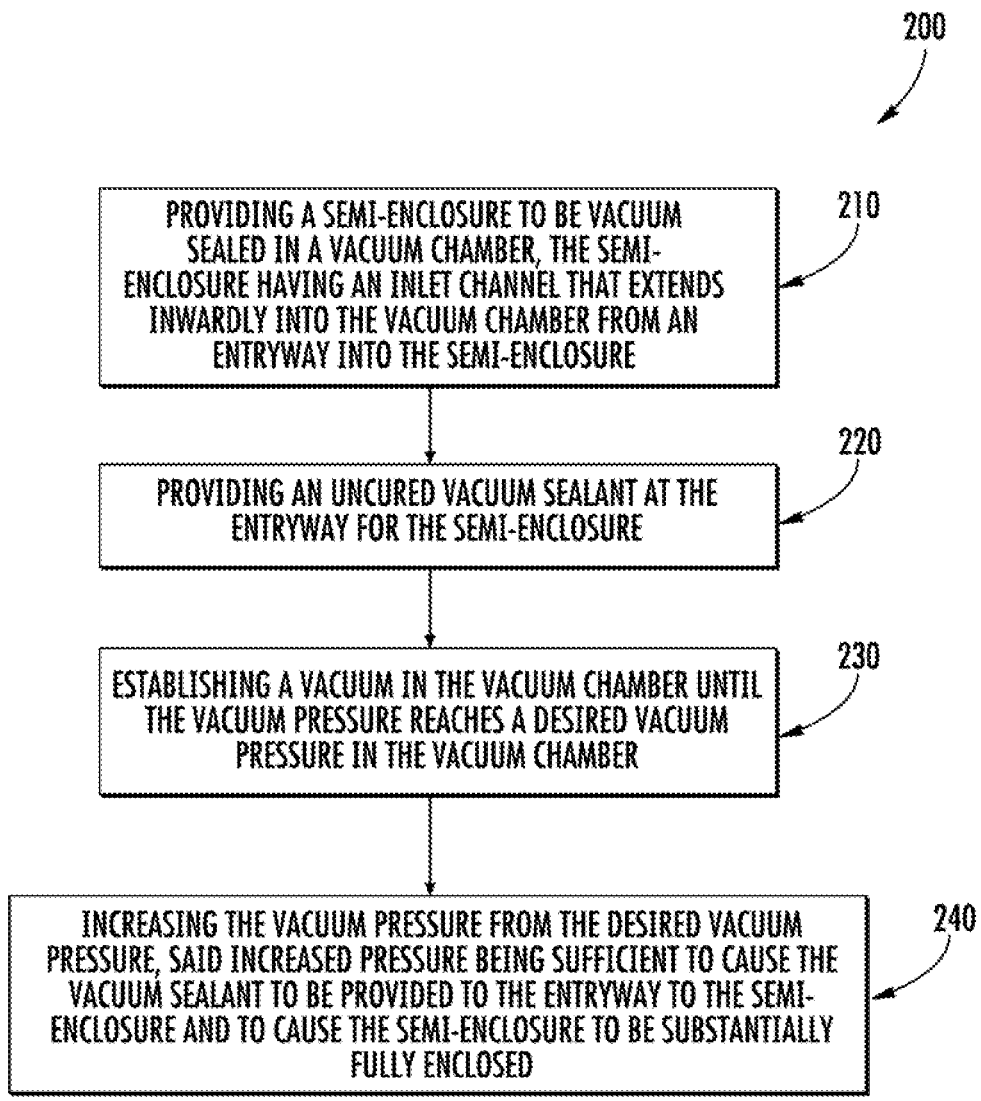
FIG. 2 is a flow chart overview for the steps in a process for low temperature vacuum sealing in accordance with one embodiment of the present disclosure.

Referring now to FIG. 2, illustrated is a flow chart overview for the general steps in a process for low temperature self-sealing vacuum packaging in accordance with one embodiment of the present disclosure. The method 200 includes a number of steps. At step 210, the method includes providing a semi-enclosure to be vacuum sealed in a vacuum chamber, the semi-enclosure has an inlet channel that extends inwardly into the vacuum chamber from an entryway into the semi-enclosure. The semi-enclosure is substantially fully sealed with vacuum sealant on its exterior except for the opening where the entryway is located.

At step 220, the method includes providing an uncured entryway vacuum sealant at the entryway for the semi-enclosure. The uncured entryway vacuum sealant may have sufficient viscosity or surface tension to cause the sealant to substantially close or cover the entryway when a desired vacuum pressure is reached. The uncured entryway vacuum sealant may substantially close or cover the entryway to such an extent that no gas or air freely passes through the entryway without going through the uncured entryway vacuum sealant. It may be desirable for the uncured entryway vacuum sealant to close or cover the entryway without progressing beyond a certain point. For example, it may be desirable for the uncured entryway vacuum sealant not to go beyond the entryway (an exterior opening) into the semi-enclosure. The viscosity or surface tension of the uncured entryway vacuum sealant may be a factor in causing the uncured vacuum sealant not to enter the semi-enclosure. The size of the entryway may also aid in stopping the uncured entryway vacuum sealant from further progressing into the semi-enclosure. With the information contained herein, a person having ordinary skill in the art can create such a semi-enclosure having an appropriate entryway size/dimensions. With the information contained herein, one of ordinary skill in the art can also select an uncured entryway vacuum sealant having the appropriate viscosity or surface tension.

At step 230, the method also includes establishing a vacuum in the vacuum chamber until the vacuum pressure reaches a desired vacuum pressure in the vacuum chamber, the desired pressure causing the entryway to be closed or covered with uncured vacuum sealant. For example, the desired vacuum pressure may permit air or other gas to escape the semi-enclosure by bubbling through the uncured entryway vacuum sealant. Alternatively, the desired vacuum pressure may cooperate with a force of gravity to cause uncured entryway vacuum sealant to be provided to the entryway of the semi-enclosure. A person of ordinary skill in the art would appreciate that factors influencing the desired vacuum pressure include, for example, the size of the entryway, the viscosity of the uncured entryway vacuum sealant, the vapor pressure of the uncured entryway vacuum sealant, and the distance of the uncured entryway vacuum sealant from the entryway.

Various pressures may be pertinent to carry out the low temperature self-sealing vacuum packaging system and method described herein. First, there is atmospheric pressure outside vacuum chamber, which may be the pressure inside the semi-enclosure before the semi-enclosure is subject to the vacuum. Second, there is the pressure inside the vacuum chamber based on a desired amount of vacuum, which is less than atmospheric pressure. Third, there is the pressure inside the semi-enclosure—or semi-enclosure pressure—which is slightly higher than pressure inside the vacuum chamber, but lower than atmospheric pressure. The desired vacuum pressure may be lower than atmospheric pressure, but greater than the vacuum chamber pressure when the vacuum chamber is in use. Fourth, a pump-down pressure may be lower than the desired pressure, and may be used to evacuate the semi-enclosure.

At step 240, optionally, the method includes increasing the vacuum pressure from the desired vacuum pressure, said increased pressure being sufficient to cause the uncured entryway vacuum sealant to be provided to the inlet to the semi-enclosure, thus causing the inlet channel to be substantially fully filled.

Various objects or semi-enclosures may be sealed with the low temperature self-sealing vacuum packaging system and method of the present disclosure. It should be noted that, in lieu of a bottle, other containers may be used. The containers may include boxes, storage vessels, freeze-dry packets for any number of items.

Figure 3:
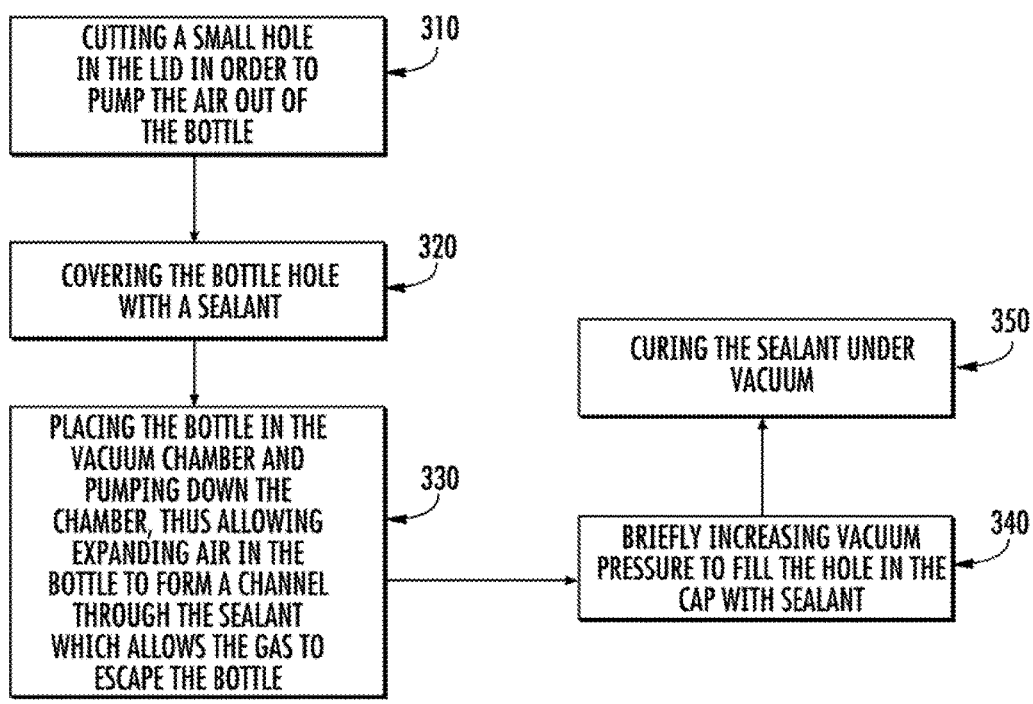
FIG. 3 is a flow chart showing steps in a process for low temperature vacuum sealing of a plastic bottle in accordance with one embodiment of the present disclosure.

FIG. 3 is a flow chart showing steps in a process for low temperature vacuum sealing of a plastic bottle in accordance with one embodiment of the present disclosure. The steps of the flow chart of FIG. 3 will be described in conjunction with the graphics of FIGS. 4A-4G. FIGS. 4A-4G show the condition/stage of the bottle as each method step of FIG. 3 is performed.

Figure 4A:
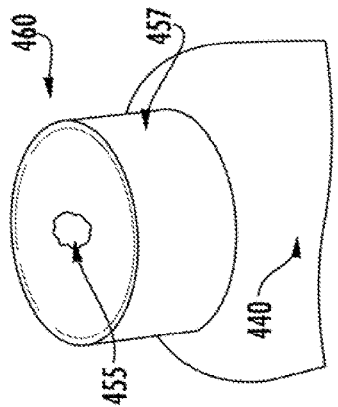
FIGS. 4A-4G are pictorials of the stages of packaging for low temperature vacuum sealing of the plastic bottle in accordance with one embodiment of the present disclosure.

At step 310, a small hole has been cut into the lid of a bottle in order to pump the air out of the bottle. Referring now to FIG. 4A, a bottle 440 is shown with an exterior opening 445 cut into the lid. The bottle 440 may be considered a semi-enclosure, the exterior opening 445 in bottle cap 457 may be considered an entryway, and the hole 450 that traverses the thickness of the bottle cap 457 may be considered an inlet channel.

Figure 4B:
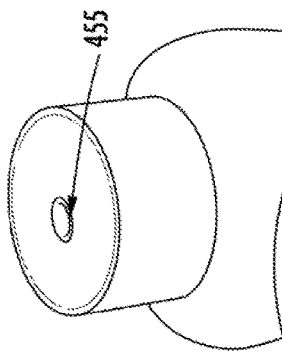

Referring back to FIG. 3, at step 320, the method step includes covering the bottle hole with a sealant. In the present embodiment, no other sealant is needed except at the entryway. Because no device is intended to be vacuum sealed inside the bottle, then no cavity may be needed to protect the device from damage or degradation by the sealant. FIG. 4B shows the bottle 440 after the exterior opening (not shown in FIG. 4B) has been covered with uncured entryway vacuum sealant 455. The viscosity of the uncured entryway vacuum sealant 455, e.g., epoxy resin, prevents it from dripping through the hole, into the bottle 440.

At step 330, the method includes placing the bottle in the vacuum chamber and pumping down the vacuum chamber. This pumping down allows expanding air in the interior of the bottle to form an inlet channel through the sealant which allows the gas to escape the bottle.

Figure 4C:
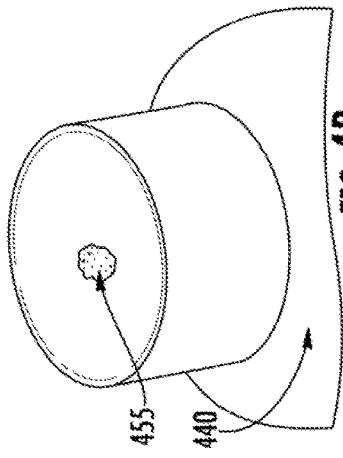

Referring now to FIG. 4C, illustrated is the bottle 440 as it appears when it is placed in the interior of vacuum chamber 460 with the uncured entryway vacuum sealant 455. The quality of the vacuum in the vacuum chamber 460 may be substantially equivalent to the quality of the vacuum in the interior of the bottle 440. The vacuum pressure may be measured in millitorr or microtorr. Various types of pumps may be used to create the vacuum. For example, a millitorr pressure range can be accomplished with a mechanical pump. A microtorr level pressure range can be accomplished with a mechanical pump that is joined by a diffusion pump, turbo pump or cryo-pump. The pressure depends upon the pressure desired in the interior of the bottle 440. The desired pressure should be sufficient to permit air to escape the bottle 440 due to the difference in pressure in the interior of the bottle 440 versus pressure in the vacuum chamber 460.

Figure 4D:
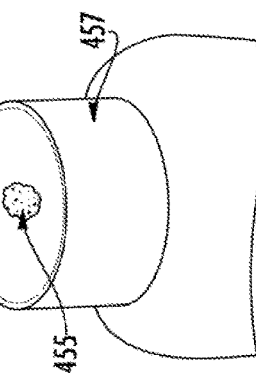
Figure 4E:
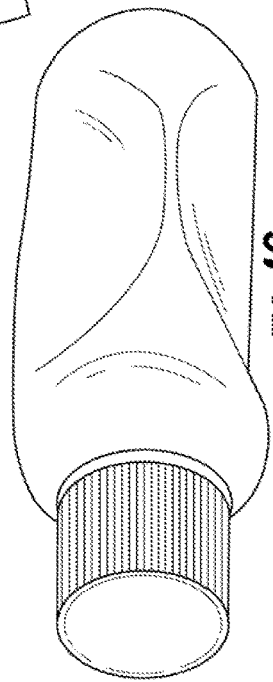

Referring to FIGS. 3 and 4D together, at step 340, the method includes briefly increasing the vacuum pressure to fill the hole in the bottle cap 457 with uncured entryway vacuum sealant 455. As the system pumps down, the expanding air in the bottle 440 has formed an inlet channel 450 through the sealant, which allows the gas 470 to escape from the bottle 440. After the bottle 440 has been pumped down, the inlet channel 450 then collapses. Referring now to FIG. 4E, a short increase in system pressure fills the hole in the bottle cap 457 with uncured entryway vacuum sealant 455.

Figure 4F:
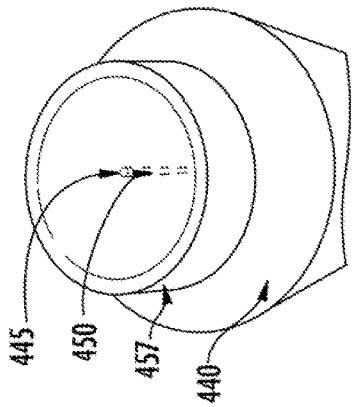
Figure 4G:
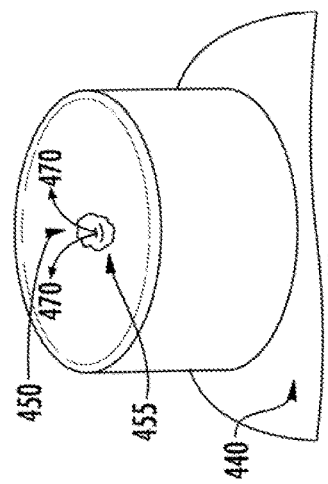

Referring back to FIG. 3, at step 350, the sealant is allowed to fully cure under vacuum. Referring now to FIG. 4F, illustrated is the bottle 440 as the uncured entryway vacuum sealant 455 is allowed to cure under vacuum. Referring now to FIG. 4G, this figure shows that the bottle 440, which may be plastic and deformable, has collapsed. The collapsing of the bottle 440 when it is removed from the vacuum proves that the bottle 440 has been successfully vacuum sealed. This proof of sealing may also be seen with other containers that are capable of collapsing, or otherwise indicating that vacuum sealing has occurred.

Figure 5:
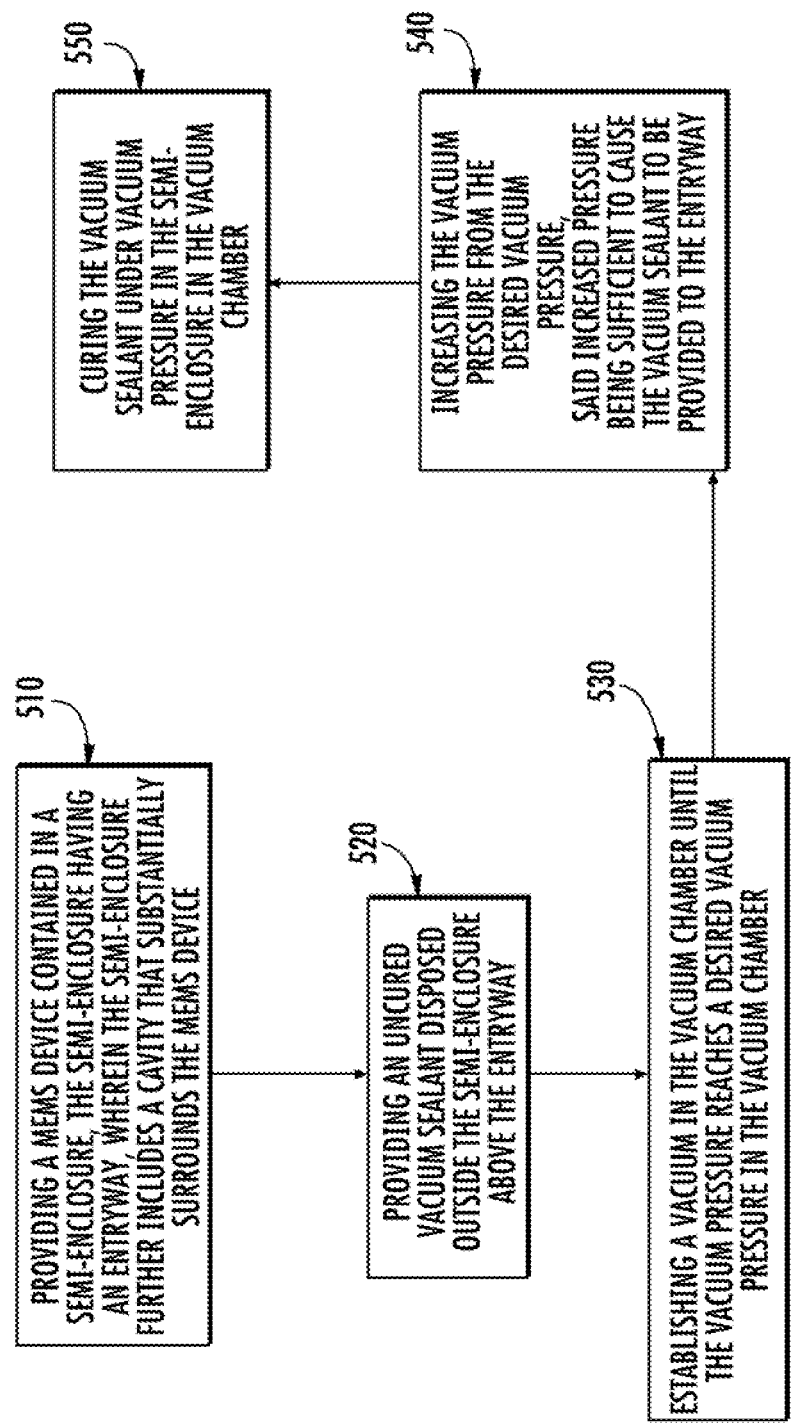
FIG. 5 is a flow chart showing steps in a process for low temperature vacuum sealing of a MEMS device in accordance with one embodiment of the present disclosure.

FIG. 5 is a flow chart showing steps in a process for low temperature vacuum sealing of a MEMS device in accordance with one embodiment of the present disclosure. At step 510, the method includes providing a MEMS device contained in a semi-enclosure, the semi-enclosure having an entryway. The semi-enclosure further includes a cavity that substantially surrounds the MEMS device. The entryway may be an exterior opening in the semi-enclosure that leads from the exterior to an inlet channel. At step 520, the method includes providing an uncured entryway vacuum sealant disposed outside the semi-enclosure above (and adjacent) the entryway. At step 530, the method includes establishing a vacuum in the vacuum chamber until the vacuum pressure reaches a desired vacuum pressure in the vacuum chamber. The desired pressure may cause the entryway to be substantially closed and sealed.

Optionally, in addition to the entryway being filled, the inlet channel may also be filled with uncured entryway vacuum sealant by increasing the vacuum pressure. At step 540, the method includes increasing the vacuum pressure from the desired vacuum pressure, said increased pressure being sufficient to cause the vacuum sealant to be provided to the entryway until the vacuum sealant is provided to the inlet channel.

At step 550, the method includes curing the vacuum sealant under vacuum pressure in the semi-enclosure in the vacuum chamber. After this, the sealed MEMS device package may be removed from the vacuum chamber.

FIGS. 6A-6I are graphics corresponding to stages of a process for low temperature vacuum sealing of a MEMS device in accordance with one embodiment of the present disclosure.

The present system and method can be used to vacuum seal a number of different items. FIG. 6A shows a MEMS device being sealed with a variation of this method. FIG. 6A shows the MEMS device 610 mounted on a backing 615. FIG. 6B shows MEMS device 610 surrounded by a cavity 620. Cavity 620 is empty space that is designed to provide distance between MEMS device 610 and vacuum sealant 630. (Although the MEMS device 610 may appear to make contact with the vacuum sealant 630 from the perspective shown in this illustration, MEMS device 610 does not make contact with vacuum sealant 630.) Entryway 635 is an exterior opening in semi-enclosure 640. Vacuum sealant 630 is contained in semi-enclosure 640.

Semi-enclosure 640 is a glass cover mounted with vacuum sealant 630. An inlet channel b in the form of a gap in semi-enclosure 640 exists in the vacuum sealant 630 in order to allow the semi-enclosure 640 to be pumped down.

In FIG. 6C, uncured entryway vacuum sealant 655 may be situated so that gravity will eventually bring it to the inlet channel 650 in the semi-enclosure 640. In this respect, the uncured entryway vacuum sealant 655 is supplied by gravity, since it is situated above the semi-enclosure 640. As shown in FIGS. 6D and 6E, together, when uncured entryway vacuum sealant 655 is placed vertically above the semi-enclosure 640 in the vacuum chamber 660, the semi-enclosure 640 may pump out air until gravity closes the top of the inlet channel 650. The semi-enclosure 640 continues to pump down by bubbling through the additional sealant 655. As shown in FIG. 6F, the uncured entryway vacuum sealant 655 has dropped lower due to the force of gravity, further covering the former entryway opening.

As shown in FIG. 6G, after the semi-enclosure 640 has had sufficient time to pump down, but before the uncured entryway vacuum sealant 655 has cured, the pressure in the semi-enclosure 640 is briefly increased, filling the inlet channel b in the semi-enclosure 640 with the uncured entryway vacuum sealant 655. As shown in FIG. 6H, the semi-enclosure 640 is then pumped down again and the vacuum sealant 630 as well as uncured entryway vacuum sealant 655 is allowed to cure under vacuum. It should be noted that both vacuum sealant 630 as well as uncured entryway vacuum sealant 655 are allowed to cure in this embodiment. However, it should be understood that the vacuum sealant 630 could be already cured, and the curing process may occur here solely for uncured entryway vacuum sealant 655. As shown in FIG. 6I, after the sealant 630 is fully cured, the MEMS device 610 is removed from the vacuum chamber 660 and the excess vacuum sealant 630 and excess uncured entryway vacuum sealant 665 are milled off.

It will be understood that many additional changes in the details, materials, steps and arrangement of parts, which have been herein described and illustrated to explain the nature of the invention, may be made by those skilled in the art within the principle and scope of the invention as expressed in the appended claims.

What is claimed is:

1. A method for low temperature self-sealing vacuum packaging, comprising the steps of:
   providing a semi-enclosure to be vacuum sealed in a vacuum chamber, the semi-enclosure having an inlet channel that extends inwardly into the vacuum chamber from an entryway into the semi-enclosure;
   providing an uncured entryway vacuum sealant at the entryway of the semi-enclosure, and wherein a viscosity of the uncured entryway vacuum sealant and a size of the entryway are configured to permit the uncured entryway vacuum sealant to substantially cover the entryway when a desired pressure is reached in the vacuum chamber;
   establishing a vacuum in the vacuum chamber until a desired vacuum pressure is reached in the semi-enclosure, the desired vacuum pressure being configured to cause the uncured entryway vacuum sealant to substantially cover the entryway of the semi-enclosure due to a difference in pressure between the desired vacuum pressure and a vacuum chamber pressure, wherein the desired vacuum pressure is lower than the vacuum chamber pressure; and
   curing the uncured entryway vacuum sealant under a vacuum pressure in the semi-enclosure in the vacuum chamber.

2. The method of claim 1, further comprising the step of:
   before the curing step, increasing the vacuum chamber pressure from the desired vacuum pressure, said increased vacuum chamber pressure being sufficient to cause the uncured entryway vacuum sealant to be provided to the inlet channel of the semi-enclosure, thus causing the inlet channel to be substantially fully filled.

3. The method of claim 1, wherein the desired vacuum pressure is configured to allow a force of gravity to cause the uncured entryway vacuum sealant to be provided to the entryway.

4. The method of claim 1, wherein the desired vacuum pressure is further configured to bubble gas through the uncured entryway vacuum sealant after the uncured entryway vacuum sealant has covered the entryway.

5. The method of claim 1, wherein the semi-enclosure includes a MEMS device disposed therein, the semi-enclosure further including a cavity that substantially surrounds the MEMS device, and wherein the semi-enclosure is substantially filled with vacuum sealant except for the entryway and the cavity.

6. The method of claim 5, wherein the semi-enclosure has at least one conductive epoxy feed-through opening configured to receive an electrical connection for the MEMS device.

7. The method of claim 1, wherein the semi-enclosure is a container.

8. The method of claim 1, wherein the vacuum sealant is an organic sealant.

9. The method of claim 1, wherein the semi-enclosure further includes an edible product.

10. The method of claim 1, wherein the curing step includes the step of curing the vacuum sealant under vacuum pressure in the semi-enclosure in the vacuum chamber.

11. A system for low temperature self-sealing vacuum packaging, comprising:
    a semi-enclosure having an inlet channel that extends inwardly into the semi-enclosure from an entryway into the semi-enclosure;
    an uncured vacuum sealant provided at the entryway of the semi-enclosure, wherein a viscosity of the vacuum sealant and a size of the entryway are configured to permit the vacuum sealant to substantially close the entryway when a desired pressure is reached in a vacuum chamber;
    a vacuum chamber configured to provide at least two vacuum pressures, the two vacuum pressures including a desired vacuum pressure and an increased vacuum pressure, the desired vacuum pressure being configured to cause the vacuum sealant to be provided to the entryway of the semi-enclosure, and wherein the increased vacuum pressure is sufficient to cause the uncured entryway vacuum sealant to be provided to the inlet channel of the semi-enclosure, thus causing the inlet channel to be substantially filled.

12. The system of claim 11, wherein the semi-enclosure includes a MEMS device disposed therein, the semi-enclosure further including a cavity that substantially surrounds the MEMS device.

13. The system of claim 12, wherein the semi-enclosure has at least one conductive epoxy feed-through opening configured to receive an electrical connection.

14. The system of claim 11, wherein the semi-enclosure is a container.

15. The system of claim 11, wherein the vacuum sealant is an organic sealant.

16. The system of claim 11, wherein the semi-enclosure further includes an edible product.

17. A method for low temperature self-sealing vacuum packaging, comprising the steps of:
    providing a MEMS device contained in a semi-enclosure, wherein the semi-enclosure is to be vacuum sealed in a vacuum chamber, the semi-enclosure having an entryway and an inlet channel, wherein the semi-enclosure further includes a cavity that substantially surrounds the MEMS device,
    providing an uncured entryway vacuum sealant disposed outside the semi-enclosure and above the entryway, and wherein a viscosity of the uncured entryway vacuum sealant and a size of the entryway are configured to permit the uncured entryway vacuum sealant to substantially cover the entryway when a desired pressure is reached in the vacuum chamber;

establishing a vacuum in the vacuum chamber until a semi-enclosure pressure reaches a desired vacuum pressure in the semi-enclosure, wherein the desired vacuum pressure is configured to allow a force of gravity to cause the uncured entryway vacuum sealant to substantially cover the entryway;

increasing the semi-enclosure pressure from the desired vacuum pressure, said increased semi-enclosure pressure being sufficient to cause the vacuum sealant to be provided to the inlet channel to be substantially fully filled and the semi-enclosure to be substantially fully enclosed; and curing the uncured entryway vacuum sealant under a vacuum pressure in the semi-enclosure in the vacuum chamber.

18. The method of claim 17, wherein the semi-enclosure has at least one conductive epoxy feed-through configured to receive an electrical connection for the MEMS device.

19. The method of claim 17, wherein the vacuum sealant is an organic sealant.

20. The method of claim 17, wherein the semi-enclosure is a glass cover.

\* \* \* \* \*